United States Patent
MacIntosh

(10) Patent No.: US 10,057,982 B2
(45) Date of Patent: Aug. 21, 2018

(54) SOLDERLESS BREADBOARD

(71) Applicant: INTERNATIONAL BUSINESS MACHINES CORPORATION, Armonk, NY (US)

(72) Inventor: Fraser I. MacIntosh, Reading (GB)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 33 days.

(21) Appl. No.: 15/399,924

(22) Filed: Jan. 6, 2017

(65) Prior Publication Data

US 2018/0199430 A1    Jul. 12, 2018

(51) Int. Cl.
*H05K 1/02* (2006.01)
*H05K 1/11* (2006.01)

(52) U.S. Cl.
CPC .......... *H05K 1/0286* (2013.01); *H05K 1/115* (2013.01); *H05K 2201/10303* (2013.01); *H05K 2201/10363* (2013.01)

(58) Field of Classification Search
CPC .................. H05K 1/115; H05K 2201/10303
USPC ........................................ 174/254
See application file for complete search history.

(56) References Cited

U.S. PATENT DOCUMENTS

| 3,316,520 | A | * | 4/1967 | Herman | H01R 9/00 |
| | | | | | 439/44 |
| 3,781,763 | A | * | 12/1973 | Feeser | G06F 9/02 |
| | | | | | 439/353 |
| 2004/0099439 | A1 | * | 5/2004 | Swetland | G09B 23/18 |
| | | | | | 174/260 |
| 2005/0057517 | A1 | | 3/2005 | Rix | |
| 2013/0107413 | A1 | * | 5/2013 | Moore | H01R 31/02 |
| | | | | | 361/102 |
| 2013/0223029 | A1 | | 8/2013 | Olivera Brizzio | |
| 2015/0357078 | A1 | | 12/2015 | Lessing et al. | |

* cited by examiner

*Primary Examiner* — Timothy Thompson
*Assistant Examiner* — Charles Pizzuto
(74) *Attorney, Agent, or Firm* — Griffiths & Seaton PLLC

(57) ABSTRACT

Embodiments of the invention provide a solderless breadboard for prototyping electrical circuits. The breadboard includes a plurality of electrically conductive lines arranged parallel to each other on an electrically non-conductive breadboard structure. An electrically conductive line includes a plurality of electrical insertion positions and at an electrical insertion position a moveable electrically conductive line section which is operable for breaking the electrically conductive line in moving from a closed to an open position. A plurality of pegs are inserted into the breadboard structure at electrical insertion positions to contact the moveable sections. A peg is rotatable after insertion and includes a head portion and a cylindrical shaft extending from the head portion to a terminating foot. The shaft includes a centrally arranged channel extending from an opening in the head portion towards the terminating foot.

20 Claims, 6 Drawing Sheets

SOLDERLESS BREADBOARD

BACKGROUND

The term solderless breadboard describes the base board of a system for building electronic circuits. In this system, the breadboard comprises an electrically non-conductive board having a regular array of plug positions comprising holes for insertion of wires or electrical component leads. From this arises the term plugboard which is also used for this type of board. Plug positions are electrically conductive and each joins to at least one other plug position by an electrically conductive link. This may be a conductive strip on the underside of the board, for example a copper strip. An engineer may construct a circuit by plugging and unplugging leads of a number of electrical components using the plug positions. The reusable construction of the breadboard allows an engineer to build a circuit, test it and change its design until a final working design is achieved. At this point the design may be constructed in a production environment, for example on a printed circuit board.

FIG. 1 depicts a plan view of the upper surface of part of a known solderless breadboard 100 including an example circuit portion. Electrically conductive strips or lines 110 are arranged in rows. Typically, at the mid-point of the breadboard electrically conductive rows 110 comprise a gap 105 providing a position for mounting integrated circuit components such as component 120. Components such as component 130 may be plugged in, connecting adjacent rows. Rows and separated portions of rows 110 may be connected by plugging in electrically conductive wire connections 115, 115a. In FIG. 1, the rightmost pins of integrated circuit 120 are connected by using the three conductive wire connections labelled 115a.

Stripboard is another form of prototyping board, but of a more permanent form using soldered components. A particular example is Veroboard®. A stripboard comprises a regular array of holes for receiving electrical component leads. Rows of holes in the board are joined by electrically conductive strip on one side of the board, for example copper strip on the lower surface. Connections between adjacent holes on the same row may be broken by cutting away the joining part of the electrically conductive strip.

FIG. 2 depicts a plan view of the upper surface of part of a known stripboard 200 incorporating a circuit portion having the same functionality as that of FIG. 1. Components and connections such as connection 125 are inserted and soldered to stripboard 200. In this case, the rightmost pins of integrated circuit 120 are connected by leaving electrically conductive strip 135 of the stripboard (shown by a dashed line) in place. The electrically conductive strips between the remaining pins are scraped away to break the connections.

In an example, when prototyping electronic circuits, an engineer uses a solderless breadboard until the circuit is working correctly. The engineer then transfers the design to stripboard to construct a more permanent soldered prototype. A production facility may then produce a production version using printed circuit technology if required.

It would be advantageous to provide a prototyping board construction allowing greater flexibility in construction and operation.

SUMMARY

Embodiments of the invention provide a solderless breadboard for prototyping electrical circuits. The breadboard includes a plurality of electrically conductive lines arranged parallel to each other on an electrically non-conductive breadboard structure. An electrically conductive line includes a plurality of electrical insertion positions and at an electrical insertion position a moveable electrically conductive line section which is operable for breaking the electrically conductive line in moving from a closed to an open position. A plurality of pegs are inserted into the breadboard structure at electrical insertion positions to contact the moveable sections. A peg is rotatable after insertion and includes a head portion and a cylindrical shaft extending from the head portion to a terminating foot. The shaft includes a centrally arranged channel extending from an opening in the head portion towards the terminating foot. The channel is adapted for receiving a wire so as to make an electrical connection between the wire and the moveable electrically conductive line section at that electrical insertion position. The cylindrical shaft includes a camming portion which is further from the head portion in one part than another so that, when the peg is rotated, a camming action of the further part on the moveable section moves it between a closed and an open position.

Embodiments provide a breadboard and a peg suitable for insertion in the breadboard. In embodiments, the peg terminating foot includes the camming portion and is electrically conductive, and a wire inserted in the peg channel makes an electrical connection with the terminating foot and thereby with the moveable electrically conductive line section. In embodiments, the terminating foot includes the camming portion, and the moveable electrically conductive line section includes at least one projecting electrical contact arranged so that a wire inserted in the peg channel makes an electrical connection with the projecting electrical contact and thereby with the moveable electrically conductive line section.

In embodiments, the peg shaft includes an external cutaway slot through which a contacting portion of the projecting electrical contact protrudes to make the electrical connection with the inserted wire. In embodiments, the channel includes an opening in the terminating foot through which the projecting electrical contact passes to make the electrical connection with the inserted wire. In embodiments, the moveable electrically conductive line section includes at least one projecting electrical contact including a contacting portion, the peg shaft including an external cutaway slot through which the contacting portion protrudes to make the electrical connection with a wire inserted in the peg channel, and in which the slot is shaped so as to form the camming portion operable for exerting a camming action on the protruding contacting portion.

In embodiments, the moveable section is biased towards the closed position. In embodiments, the moveable section is biased towards the closed position by a separate biasing means.

In embodiments, a peg head includes a shaped form for assisting peg rotation and for indicating the connection state of the moveable section at that position.

Embodiments provide a method for constructing an electrical circuit based on the solderless breadboard.

BRIEF DESCRIPTION OF THE DRAWINGS

Embodiments of the present invention will now be described, by way of example only, with reference to the following drawings in which.

DETAILED DESCRIPTION

Figure 1:
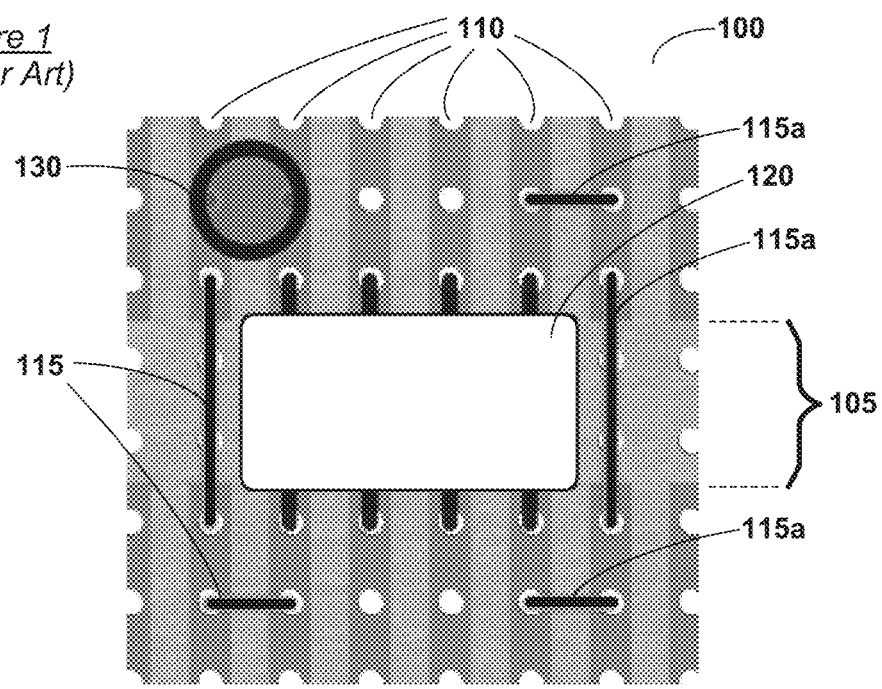
FIG. 1 depicts an example of a portion of a circuit built on a known solderless breadboard.
Figure 2:
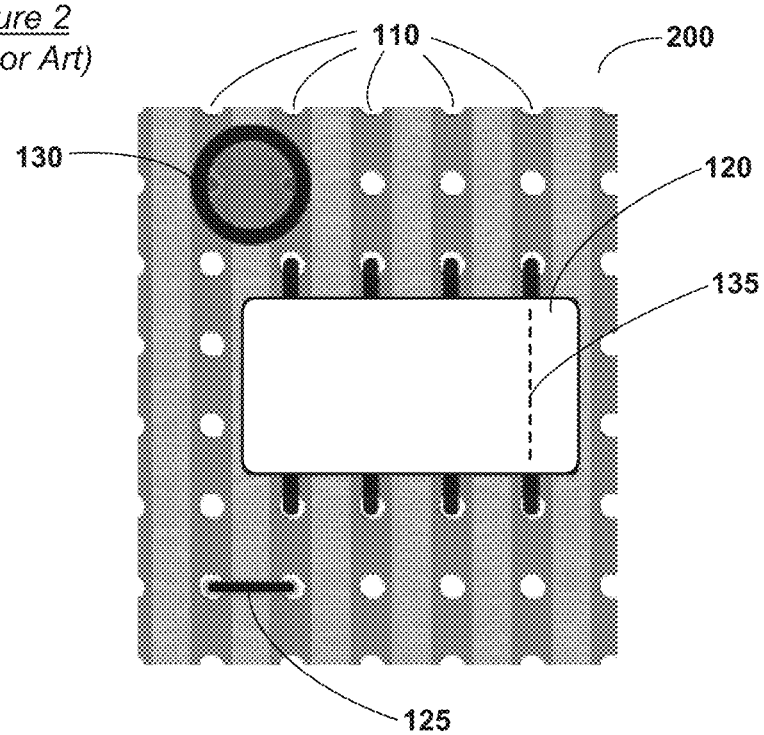
FIG. 2 depicts an example of a portion of a similar circuit built on a known stripboard.

Embodiments of the invention provide an improved solderless breadboard which provides the ability to make and break connections at multiple points along a conductor row, thus providing a more flexible arrangement for constructing circuits. Embodiments therefore incorporate some of the flexibility in circuit construction of a stripboard but with the advantage of the reversibility of a conventional solderless breadboard.

It should be understood that the accompanying figures are merely schematic and are not drawn to scale. It should also be understood that the same reference numerals are used throughout the figures to indicate the same or similar parts. Where reference is made to a top surface, a bottom surface or like descriptors relating to orientation, such descriptors are used merely for the purposes of clarity and ease of understanding with reference to the figures. They are not intended to limit the scope of the present invention. Embodiments of the present invention may be orientated in any way convenient without departing from the scope of the present invention.

Figure 3:
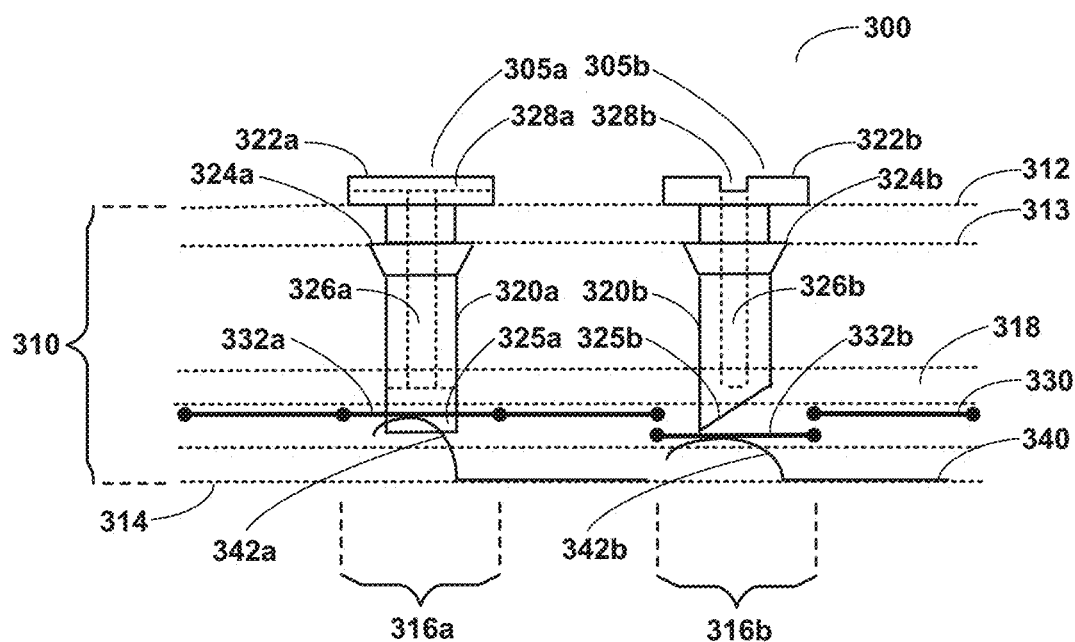
FIG. 3 depicts a cross-sectional view of a portion of a solderless breadboard according to an embodiment of the present invention.

FIG. 3 depicts a cross-sectional view of a portion of a solderless breadboard according to an embodiment of the present invention. Solderless breadboard arrangement 300 comprises a breadboard structure 310 which may be formed of any suitable electrically non-conductive material. Typically, it may comprise a resin or plastics material and may be formed by any suitable plastics forming method, for example injection molding. Breadboard structure 310 comprises a top surface 312 and a bottom surface 314, and may comprise a number of plastics layer levels optionally separated by voids. The skilled person will understand that many arrangements with and without voids are possible without departing from the scope of the invention.

Breadboard structure 310 comprises a series of electrically conductive lines 330 arranged parallel to each other as in a conventional breadboard. FIG. 3 depicts a cross section taken along one of these electrically conductive lines. Breadboard structure 310 comprises layer 318 separated from lower surface 314. Layer 318 comprises electrically conductive line 330 adjacent the lower surface of layer 318. Electrically conductive line 330 performs the function of electrically conductive lines 110 in the known breadboard of FIG. 1. Breadboard structure 310 further comprises holes positioned at intervals, positions 316a, 316b illustrated, comparable to plug positions or electrical insertion positions of the known breadboard of FIG. 1. Positions 316a, 316b are occupied by electrically conductive pegs 305a, 305b respectively.

Electrically conductive pegs 305a, 305b comprise an electrically conductive material, preferably a metal or metal alloy material. Electrically conductive pegs 305a, 305b comprise a head portion, 322a, 322b, and a shaft portion 320a, 320b. Pegs 305a, 305b are shaped and sized suitably for push fit inserting into breadboard structure 310. When fully inserted, head portion 322a, 322b is adjacent upper surface 312 of breadboard structure 310. As illustrated, the top layer with upper surface 312 has a lower surface 313. Optionally, pegs 305a, 305b comprise a neck portion 324a, 324b for retaining the peg in the breadboard, and abutting this lower surface 313 of the top layer when the peg is fully inserted, whilst not being so pronounced as to prevent full insertion of the peg.

Pegs 305a, 305b comprise a cylindrical shaft 320a, 320b preferably of smaller cross section than head portion 322a, 322b and extending from head portion 322a, 322b to a terminating foot 325a, 325b. After full insertion into breadboard structure 310 of the solderless breadboard, terminating foot 325a, 325b of peg cylindrical shaft 320a, 320b contacts electrically conductive line 330. Cylindrical shaft 320a, 320b comprises centrally positioned channel 326a, 326b extending from an opening in head portion 322a, 322b towards terminating foot over at least a substantial portion of shaft 320a, 320b and may extend over the full length of the shaft. Channel 326a, 326b may be cylindrical, or any other suitable shape. Channel 326a, 326b is operable as a channel for receiving an electrically conductive wire or lead of an electrical component which may be inserted at the head portion end so as to make an electrical contact with respective peg 305a, 305b. Channel 326a, 326b may comprise further retaining means, for example a channel restriction or protuberance or other construction, to retain a wire or lead once it is inserted and to ensure a good electrical contact.

It is known that breadboard prototyping may suffer problems relating to capacitance, particularly with higher frequencies (for example greater than 10 MHz). It is therefore desirable to provide pegs formed from alternative materials. Variation in this area may provide breadboards appropriate for use over a range of applications, for example where higher frequencies are employed.

In alternative embodiments, pegs 305a, 305b comprise alternative materials. In some embodiments, pegs 305a, 305b comprise electrically conductive and electrically non-conductive portions. In one embodiment, one end comprising head portion 322a, 322b and neck portion 324a, 324b comprises a non-conductive material, and the other end comprising cylindrical shaft 320a, 320b and terminating foot 325a, 325b comprises an electrically conductive material.

In the embodiments of FIG. 3, electrically conductive line 330 is not a continuous electrical conductor as in prior art breadboards. In an embodiment, electrically conductive line 330 comprises sections at plug positions which are detached from the remainder of the electrically conductive line. The remainder of the electrically conductive line 330 is fixed to the breadboard structure 310. As shown in FIG. 3, positions 316a and 316b comprise detached moveable conductor sections 332a and 332b respectively. Detached sections are operable for movement from a closed position to an open position. The closed position is shown at position 316a in which section 332a contacts the remaining portions of the conductor to form a continuous electrically conductive line 330. The open position is shown at position 316b in which section 332b does not contact the remaining portions of the conductor so that the electrically conductive line is broken.

Pegs 305a, 305b when inserted in breadboard structure 310 are operable for rotational movement in their respective holes. Peg terminating feet 325a, 325b retain contact with conductive line sections 332a, 332b respectively at substantially all positions of peg rotation. Peg terminating feet 325a, 325b comprise an asymmetric cross section. The asymmetric cross section is so shaped as to allow a moveable conductive line section section to contact the remaining conductor at a portion of the rotation of the peg as shown with section 332a at position 316a, and to move a moveable conductive line section so that it no longer contacts the remaining electrically conductive line at another portion of rotation of the peg as shown with section 332b at position 316b. At its simplest, the asymmetric cross section comprises a straight line at an oblique angle to the head section as illustrated by peg terminating foot 325b in FIG. 3.

Biasing means 342a, 342b are operable to bias movement of respective detached moveable sections 332a, 332b towards the closed position, and so towards their respective pegs 305a, 305b. Biasing means 342a, 342b may comprise any suitable resilient biasing structure and material, but preferably comprises an electrically non-conductive material such as a molded plastics material. Biasing means 342a, 342b preferably function as resilient spring members to bias moveable sections 332a, 332b towards their respective pegs 305a, 305b. Biasing means 342a, 342b may comprise part of a larger structure comprising a plurality of biasing means 340 which may, for example, be molded from a single piece of plastics material. Biasing means 342a, 342b may comprise part of an array of biasing means across a plurality of electrically conductive lines. However formed, biasing means 342a, 342b may suitably be attached to breadboard structure 310 on or adjacent to its lower surface 314.

Peg terminating feet 325a, 325b may comprise any suitable shape as viewed in cross-section. The simplest form which performs the required function is a flat surface angled obliquely with respect to head portion 322a, 322b so that one side of cylindrical shaft 320a, 320b is longer than the side opposite to it. This is shown in FIG. 3 by foot 325b of peg 305b. However, any suitable shape may be used providing only that the shaft comprises one portion which is longer than another so as to produce a camming action exerted by the foot on a moveable conductive line section, such as sections 332a, 332b.

Preferably head portion 322a, 322b of pegs 305a, 305b comprises means to aid the rotating by a user of pegs 305a, 305b in their respective holes of breadboard structure 310. In embodiments, such means comprise a shaped form of head portion 322a, 322b. In embodiments, this comprises an indentation in the form of a groove across the centre of the top of the head portion 322a, 322b into which a fingernail or suitable tool, such as a flat head screwdriver, may be inserted to turn respective peg 305a, 305b. This is illustrated by grooves 328a, 328b of head portions 322a, 322b in FIG. 3.

Figure 4:
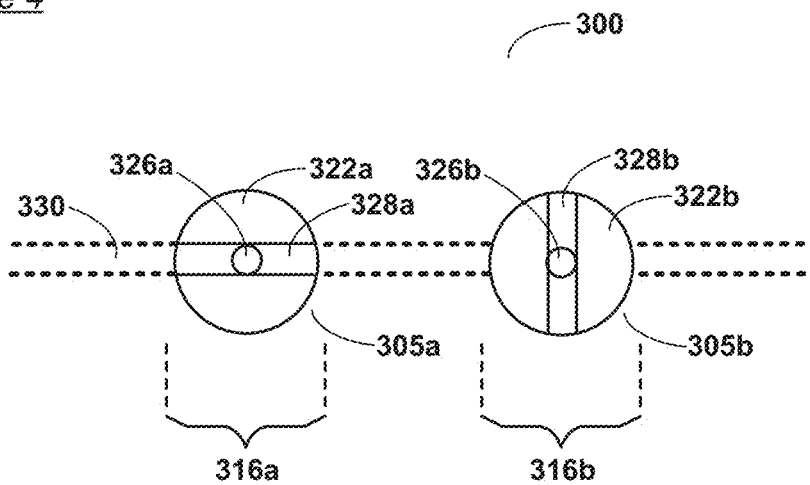
FIG. 4 depicts a plan view of the top surface of a portion of a solderless breadboard according to embodiments of the present invention.

FIG. 4 depicts a plan view of the top of the portion of breadboard 300 illustrated in FIG. 3. It will be used together with FIG. 3 to describe how pegs 305a, 305b at positions 316a, 316b function as electrical switches. Rotation of pegs 305a, 305b in their respective holes in breadboard structure 310 serves to turn their respective switch state between an "on" or closed state corresponding to a closed position of the respective electrical insertion position and an "off" or open state corresponding to an open position of the respective electrical insertion position. Thus in position 316a, peg 305a is positioned such that moveable conductor section 332a, because of the orientation of terminating foot 325a of peg 305a, contacts the remainder of the electrically conductive strip at either side. Position 316a is therefore in an "on" state which, if electrically conductive line 330 is connected to an electrical supply in such a way as to form an electrical circuit, allows electrical current to pass and makes peg 305a electrically live, so that any wire or lead inserted into channel 326a of peg 305a may also be electrically live.

At position 316b, peg 305b is orientated at 90 degrees relative to peg 305a at position 316a. Rotating peg 305b from a position the same as peg 305a at position 316a to that shown at position 316b forces moveable electrically conductive line section 332b away from the remainder of the electrically conductive line either side of it by camming action of foot 325b. This breaks electrical contact so that position 316b is in an "off" state and peg 305b is not electrically live when a current is supplied to electrically conductive line 330.

It will be apparent that groove 328a, 328b may serve a secondary function to illustrate the switch state at their respective positions 316a, 316b. Groove 328a, 328b is orientated so as to be parallel to electrically conductive line 330 when the switch state of the respective position is in the "on" state and to be at 90 degrees to electrically conductive line 330 when in the "off" state. Referring to FIGS. 3 and 4, position 316a is in the "on" state with groove 328a parallel to electrically conductive line 330. Position 316b is in the "off" state with groove 328b at 90 degrees to electrically conductive line 330. It will be apparent to the skilled person that other arrangements of head structure of pegs 305a, 305b are possible. For example, a different form of indentation than a groove may be used. One possibility is a form for driving by a cross head screwdriver, or a hex key or other similar driving arrangement. In this case, head structure of pegs 305a, 305b may comprise a separate form of indicia for indicating the switch state of the respective position, for example a marking applied to head structure 328a, 328b.

Figure 5:
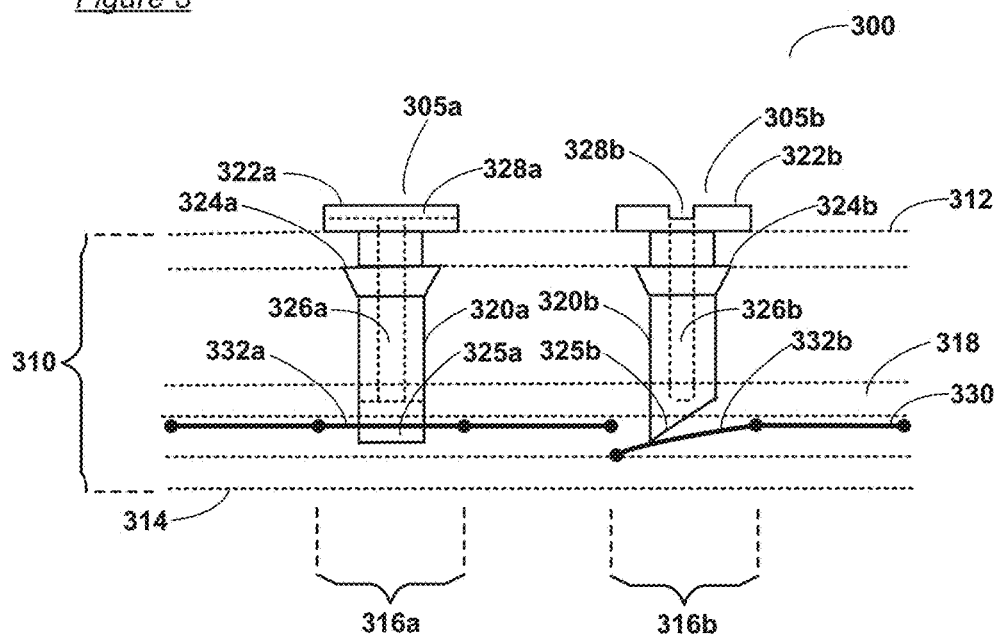
FIG. 5 depicts a cross-sectional view of a portion of a solderless breadboard according to an alternative embodiment of the present invention.

FIG. 5 illustrates a cross-sectional view of an alternative embodiment of the invention. In this embodiment, most features are as in FIG. 3. The embodiment differs in the form of electrically conductive line 330. In the embodiment, there is no separate biasing means for operating on sections 332a, 332b as in the structure of FIG. 3. In this embodiment, moveable sections 332a, 332b are joined to a remaining portion of electrically conductive line 330 at one end of the section. Sections 332a, 332b are inherently biased towards the closed position as shown for section 332a at position 316a. Resilient properties of section 332a return it to this position and to the switch state "on" when peg 305a is aligned as in FIG. 5 at position 316a. When the peg is rotated by 90 degrees as shown at position 316b, section 332b is forced away from line 330 at one side, so that position 316b is in switch state "off". It will be apparent that, in this embodiment, available states are different in that electrical current may still flow to peg 305b at position 316b if the portion of electrically conductive line 330 to the right is electrically live. Changing of the switch state of the next position to the right may be necessary to fully isolate position 316b in this case.

In a further embodiment (not shown), the moveable sections 332a, 332b are joined to a remaining portion of electrically conductive line 330 at one end as in the embodiment of FIG. 5, but a separate biasing means biases the sections to the closed position. The biasing means may be as in the embodiment described above with reference to FIG. 3. This embodiment therefore combines features of the embodiments described above and illustrated in FIGS. 3 and 5.

It is also known that some contact methods may have relatively high electrical resistance. It may therefore be desirable to provide alternative electrical contact methods.

Figure 6:
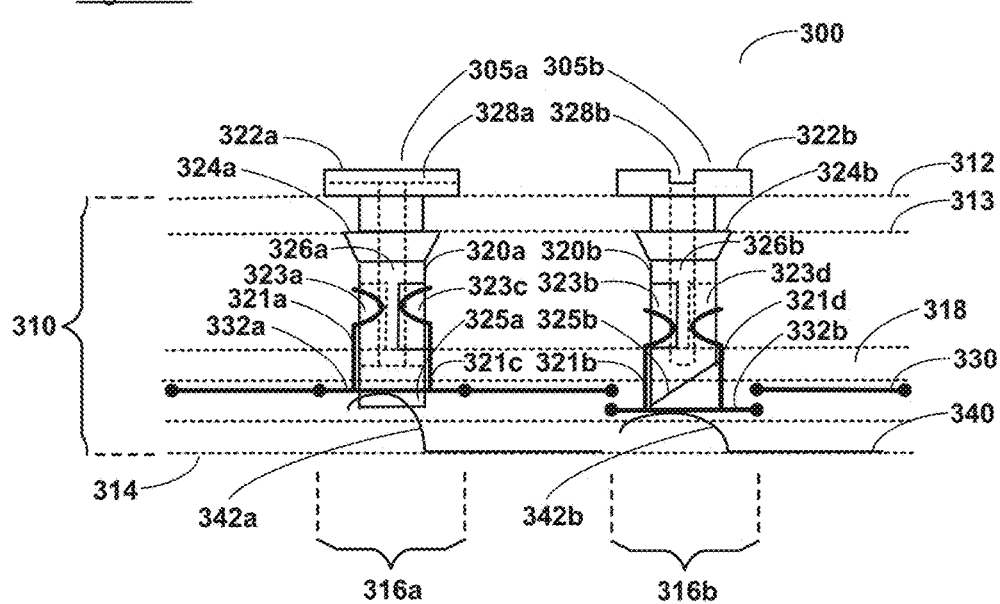
FIG. 6 depicts a cross-sectional view of a portion of a solderless breadboard according to another alternative embodiment of the present invention.

FIG. 6 illustrates a cross-sectional view of an alternative embodiment of the invention. In this embodiment, many features are as described with reference to the embodiments described with reference to FIG. 3. It differs in that pegs 305a, 305b are formed wholly from an electrically non-conductive material, for example a plastics material. Moveable portions 332a, 332b of electrically conductive line 330 comprise electrical contacts 321a, 321c and 321b, 321d respectively. These contacts extend substantially perpendicular to the remainder of moveable sections 332a, 332b respectively. In operation in breadboard 300, contacts 321a, 321c and 321b, 321d protrude into cutaway slots in pegs 305a, 305b, respectively 323a, 323c and 323b, 323d. Contacts 321a, 321c and 321b, 321d comprise a curved or otherwise appropriately shaped section forming a contacting portion. Pairs of contacting portions of contacts, respectively 321a, 321c and 321b, 321d, are directed towards each other to define between them a contacting gap. This contacting gap is of width appropriate so as to be smaller than the width of an inserted wire or component lead and thereby to provide a push fit electrical contact in which pairs of contacting portions of contacts, 321a, 321c and 321b, 321d respectively, are biased towards the other of the pair.

Cutaway slots 323a, 323c in peg 305a and 323b, 323d in peg 305b comprise segments of the circumference of respective cylindrical shafts 320a, 320b each occupying at least about 90 degrees of rotation of the respective peg so as to allow for rotation of pegs in their respective holes in breadboard structure 310. Cutaway slots 323a, 323c and 323b, 323d are sized longitudinally along the length of shafts 320a, 320b so as to allow movement of moveable conductive line sections between the "on" state of section 332a at position 316a to the "off" state of section 332b at position 316b.

Figure 7:
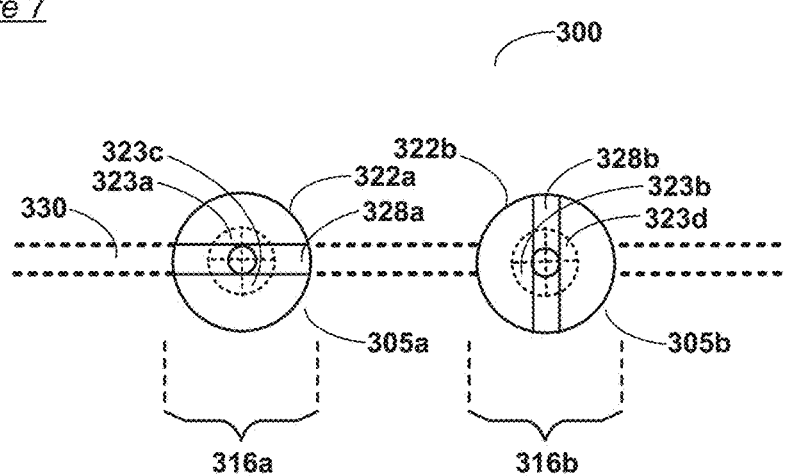
FIG. 7 depicts a plan view of the alternative embodiment of FIG. 6.

FIG. 7 illustrates a plan view of the top of the embodiment of FIG. 6 in which the positions of cutaway segments of pegs 305a, 305b, respectively 323a, 323c and 323b, 323d, are shown. It will be apparent that in this embodiment rotation of the peg is restricted by the circumferential size of the cutaway segments. Therefore, in moving from the "on" state of position 316a to the "off" state of position 316b the peg may only move in an anti-clockwise direction.

Figure 8:
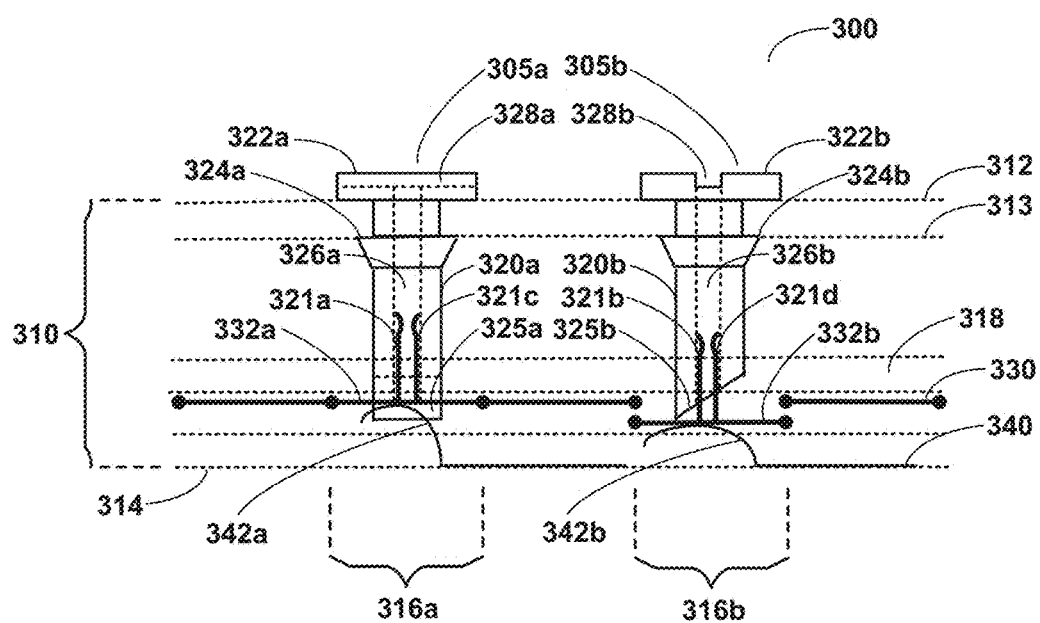
FIG. 8 depicts a cross-sectional view of a portion of a solderless breadboard according to another alternative embodiment of the present invention.

FIG. 8 illustrates another alternative embodiment of the invention. Much of this embodiment is the same as that described above in relation to FIG. 6. It differs in that electrical contacts 321a, 321c of moveable section 332a and electrical contacts 321b, 321d of moveable section 332b are positioned so as to pass through respectively channels 326a of peg 305a and 326b of peg 305b in operation in the breadboard. In this embodiment channels 326a, 326b pass from the respective head sections 322a of peg 305a and 322b of peg 305b the whole length of their respective pegs to openings in termination feet 325a, 325b. Consequently, there is no requirement for cutaway portions of the peg shafts as in the embodiment of FIGS. 6 and 7 and rotational movement of pegs 305a, 305b in their respective holes is not restricted. Contacts 321a, 321c and 321b, 321d comprise curved or otherwise suitably shaped contacting portions as described with reference to the embodiment of FIG. 6 so as to form pairs of contacting portions each defining a contacting gap. It will be apparent that although pairs of contacts are described with reference to FIGS. 6, 7 and 8, other numbers of contacts may be used. For example, a single electrical contact in each case may be used.

Figure 9:
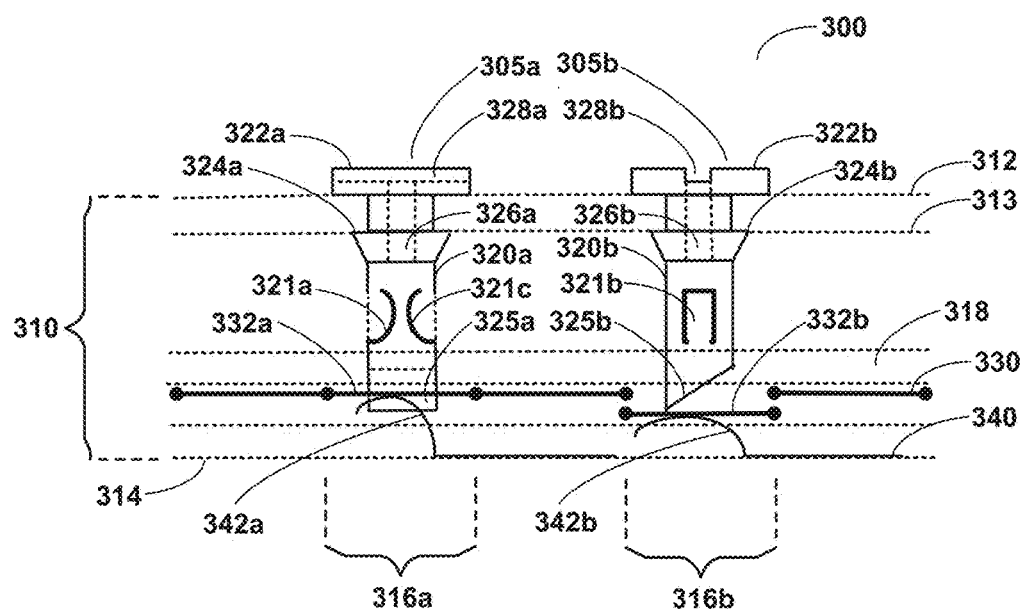
FIG. 9 depicts a cross-sectional view of a portion of a solderless breadboard according to another alternative embodiment of the present invention.

FIG. 9 illustrates another embodiment of the invention. In this embodiment, most features are as described with reference to FIG. 3. In the embodiment of FIG. 9, at least the shaft portions 320a, 320b of pegs 305a, 305b are formed from a relatively thin-walled electrically conductive material such as a metal or metal alloy. Portions of shafts 320a, 320b are cut away to form a flap which is bent towards the centre of their respective shafts so as to form contact pairs 321a, 321c and 321b, 321d (321d obscured in FIG. 9 by 321b). These contact pairs function in a manner similar to that described above with relation to the contacts of FIG. 6.

Figure 10:
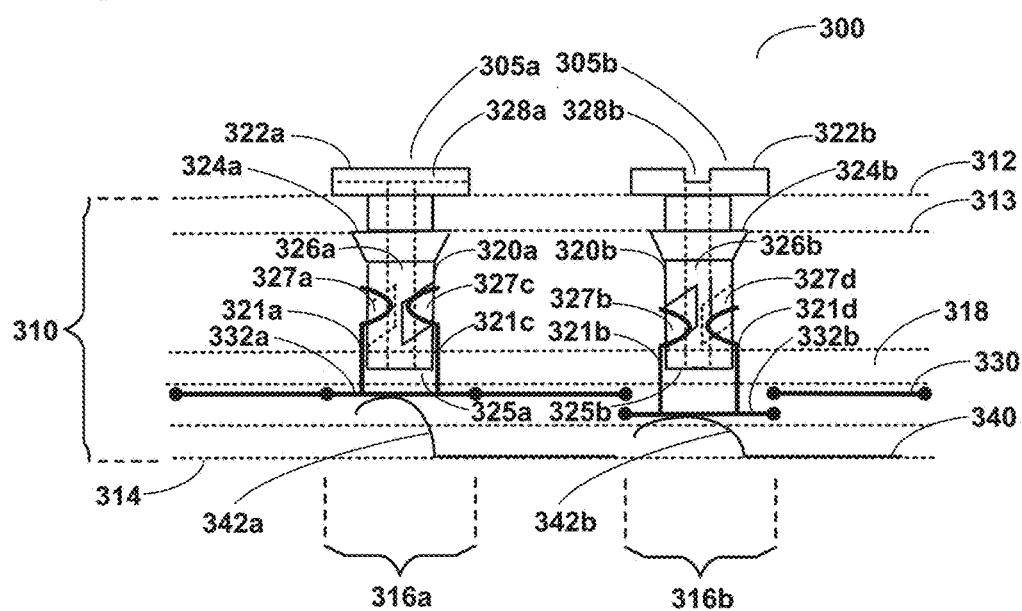
FIG. 10 depicts a cross-sectional view of a portion of a solderless breadboard according to another alternative embodiment of the present invention.

FIG. 10 illustrates another embodiment of the invention. In this embodiment, electrical contacts 321a, 321c and 321b, 321d and many features are as described with reference to the embodiment illustrated in FIG. 6. The embodiment differs from that of FIG. 6 in that the camming action exerted on moveable conductive line sections 332a, 332b produced by rotation of the peg is not exerted by respective terminating feet 325a, 325b. In this embodiment, cutaway slots comprise camming slots 327a, 327c and 327b, 327d in respective shafts 320a, 320b of pegs 305a, 305b. Shaped portions of contacts 321a, 321c and 321b, 321d engage with respective slots 327a, 327c and 327b, 327d. Slots 327a, 327c and 327b, 327d are shaped so that one part of the slot contact engaging portion is further from the respective peg head portion than another, so as to produce a camming action by the further parts on contacts when their respective pegs 305a, 305b are rotated in their respective holes of breadboard 300.

In an embodiment, camming slots 327a, 327c and 327b, 327d are angled at an oblique angle with respect to head portions 322a, 322b of pegs 305a, 305b. When a peg is rotated from the position of 316a to that of 316b, camming action of slots 327a, 327c exerted on their respective contacting portions of contacts 321a, 321c moves moveable electrically conductive line section 332a from the "on" state of position 316a to the position of section 332b in the "off" state of position 316b. Camming slots may be of any shape which provides a suitable camming action. It will be apparent that respective terminating feet do not need to conform to any particular shape in the absence of a camming function and may be of any convenient shape, for example comprising a flat surface parallel to the respective peg head portion. It will be apparent that, as with the embodiments of FIGS. 6, 7 and 8, a different number of contacts and associated slots may be envisaged, for example a single contact and corresponding single slot per peg. Any arrangement envisaged would require sufficient electrical contact between a contacting portion and a wire inserted in the peg.

Figure 11:
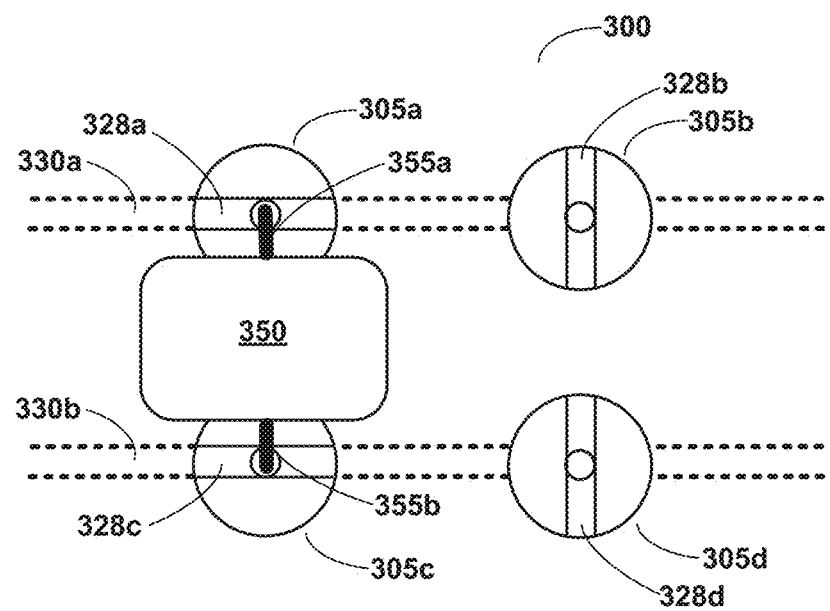
FIG. 11 depicts a plan view of a portion of a solderless breadboard according to embodiments of the present invention comprising an example configuration including an electronic component.

FIG. 11 illustrates a plan view of the top of a portion of a solderless breadboard according to embodiments. FIG. 11 shows two adjacent parallel electrically conductive lines 330a, 330b. Component 350 comprises two electrical contact wires or leads 355a, 355b. Four positions are shown with pegs 305a to 305d. Pegs 305a and 305c are in switch state "on" with grooves 328a, 328c in respective head portions 322a, 322c aligned parallel to their respective electrically conductive lines 330a, 330b. Pegs 305b, 305d are in switch state "off" with grooves 328b, 328d in respective head portions 322b, 322d aligned at 90 degrees to their respective electrically conductive lines 330a, 330b. Lead 355a of component 350 is in the channel of peg 305a and lead 355b in the channel of peg 305c. An electrical supply connected to the left hand end of lines 330a, 330b may cause current to flow through component 350. Pegs 305b, 305d in the off state isolates component 350 from electrical connection at the right hand end of electrically conductive lines 330a, 330b.

A method of constructing an electrical circuit based on the solderless breadboard includes planning a circuit outline and where a circuit break is required rotating an inserted peg so as to move the moveable section at that position to an open position. A link between two rows may be made by inserting a wire between pegs of the respective rows. Where a component is required, its leads may be inserted in channels of appropriate pegs to make a connection between the two. Connections may be made and broken by rotating adjacent pegs between closed and open positions as described above. The circuit arrangement may be changed as required, for example after testing, by rotating appropriate pegs.

Figure 12:
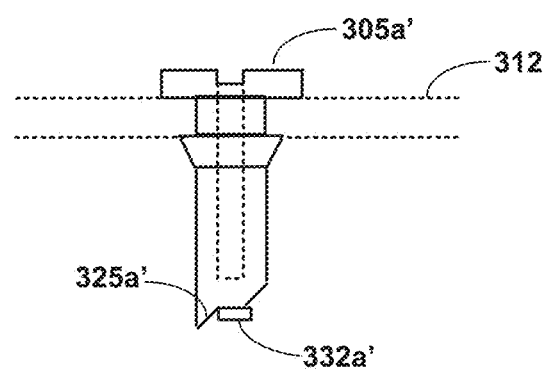
FIG. 12 depicts a cross-sectional view of a portion of a solderless breadboard showing a peg according to an embodiment of the present invention.

FIG. 12 illustrates one possible alternative shape profile for a peg terminating foot functioning as an electrical contact. FIG. 7 is a cross sectional view at 90 degrees to that of FIG. 3, across the width of electrically conductive line 330 showing breadboard top surface 312, peg 305a' and moveable conductor section 332a'. Peg 305a' is in the same position as peg 305a of FIG. 3, and so in switch state "on". Peg 305a' has terminating foot 325a' comprising a stepped cross section profile with a region substantially parallel to the plane of the electrically conductive line 330 when in operation inserted in the breadboard. This ensures contact over a larger area with moveable conductor section 332a' when in the "on" state than the angled straight cross section profile shown in FIG. 3. It will be apparent that other terminating foot shapes may be envisaged which might provide other desirable features such as ease of switching and improved electrical contact whilst retaining the required camming action without departing from the scope of the present invention.

Embodiments of the invention provide a solderless breadboard having flexibility in operation. Embodiments provide electrical insertion positions in the breadboard at which electrically conductive lines may be reversibly broken. Embodiments achieve this by using, at electrical insertion positions, moveable electrically conductive line sections and rotatable pegs. The pegs allow inserting of wires or leads of components to contact the moveable sections of the electrically conductive line. The pegs are operable for exerting camming action on the moveable sections. A peg camming portion further from the peg head in one part than another exerts a camming action on the moveable section by the further part when the peg is rotated. Although various exemplary embodiments are described above, it will be apparent to the skilled person that other constructions and configurations of components may be envisaged without departing from the scope of the present invention.

The invention claimed is:

1. A solderless breadboard for prototyping electrical circuits comprising:

a plurality of electrically conductive lines arranged parallel to each other on an electrically non-conductive breadboard structure, an electrically conductive line comprising a plurality of electrical insertion positions and at an electrical insertion position a moveable electrically conductive line section operable for breaking the electrically conductive line in moving from a closed to an open position;

a plurality of pegs inserted into the breadboard structure at the electrical insertion positions to contact the moveable sections, a peg being rotatable after insertion and comprising:

a head portion;

a cylindrical shaft extending from the head portion to a terminating foot, the shaft comprising a centrally arranged channel extending from an opening in the head portion towards the terminating foot, the channel being adapted for receiving a wire so as to make an electrical connection between the wire and the moveable electrically conductive line section at that electrical insertion position;

the cylindrical shaft comprising a camming portion which is further from the head portion in one part than another so that, when the peg is rotated, a camming action of the further part on the moveable section moves it between flail the closed and the open position.

2. The solderless breadboard of claim 1, wherein the terminating foot comprises the camming portion and is electrically conductive, and wherein a wire inserted in the peg channel makes an electrical connection with the terminating foot and thereby with the moveable electrically conductive line section.

3. The solderless breadboard of claim 1, wherein the terminating foot comprises the camming portion, and wherein the moveable electrically conductive line section comprises at least one projecting electrical contact arranged so that a wire inserted in the peg channel makes an electrical connection with the projecting electrical contact and thereby with the moveable electrically conductive line section.

4. The solderless breadboard of claim 3, wherein the peg shaft comprises an external cutaway slot through which a contacting portion of the projecting electrical contact protrudes to make the electrical connection with the inserted wire.

5. The solderless breadboard of claim 3, wherein the channel comprises an opening in the terminating foot through which the projecting electrical contact passes to make the electrical connection with the inserted wire.

6. The solderless breadboard of claim 1, wherein the moveable electrically conductive line section comprises at least one projecting electrical contact comprising a contacting portion, wherein the peg shaft comprises an external cutaway slot through which the contacting portion protrudes to make the electrical connection with a wire inserted in the peg channel, and wherein the slot is shaped so as to form the camming portion operable for exerting a camming action on the protruding contacting portion.

7. The solderless breadboard of claim 1, wherein the moveable section is biased towards the closed position.

8. The solderless breadboard of claim 7, wherein the moveable section is biased towards the closed position by a separate biasing means.

9. The solderless breadboard of claim 1, wherein the peg head comprises a shaped form for assisting peg rotation and for indicating the connection state of the moveable section at that position.

10. A breadboard for use as a solderless breadboard comprising:
an electrically non-conductive board; and
a plurality of electrically conductive lines arranged parallel to each other on the board, an electrically conductive line comprising a plurality of electrical insertion positions and at an electrical insertion position a moveable electrically conductive line section operable for breaking the electrically conductive line in moving from a closed to an open position, an electrical insertion position operable for inserting a peg, the peg comprising:
a head portion;
a cylindrical shaft extending from the head portion to a terminating foot, the shaft comprising a centrally arranged channel extending from an opening in the head portion towards the terminating foot, the channel being adapted for receiving a wire so as to make an electrical connection between the wire and a moveable electrically conductive line section when the peg is inserted at an electrical insertion position;
the cylindrical shaft comprising a camming portion which is further from the head portion in one part than another so that, when inserted in the insertion position and rotated, a camming action of the further part on the moveable section moves it between a closed and an open position.

11. The breadboard of claim 10, wherein the moveable electrically conductive line section at the insertion position comprises at least one projecting electrical contact arranged so that a wire inserted in the channel of a peg at that position makes an electrical connection with the projecting electrical contact and thereby with the moveable electrically conductive line section.

12. The breadboard of claim 11, wherein the projecting electrical contact is arranged so as to make the electrical connection with the inserted wire through an external slot in the peg shaft.

13. The breadboard of claim 11, wherein the projecting electrical contact is arranged so as to make the electrical connection with the inserted wire through an opening in the terminating foot of the peg.

14. The breadboard of claim 10, wherein the moveable section is biased towards the closed position.

15. The breadboard of claim 14, wherein the moveable section is biased towards the closed position by a separate biasing means.

16. A peg suitable for insertion into an electrical insertion position of a solderless breadboard, the breadboard comprising:
an electrically non-conductive board; and
a plurality of electrically conductive lines arranged parallel to each other on the board, an electrically conductive line comprising a plurality of electrical insertion positions and at an electrical insertion position a moveable electrically conductive line section operable for breaking the electrically conductive line in moving from a closed to an open position, an electrical insertion position operable for inserting the peg, the peg comprising:
a head portion;
a cylindrical shaft extending from the head portion to a terminating foot, the shaft comprising a centrally arranged channel extending from an opening in the head portion towards the terminating foot, the channel being adapted for receiving a wire so as to make an electrical connection between the wire and a moveable electrically conductive line section when the peg is inserted at an electrical insertion position;
the cylindrical shaft comprising a camming portion which is further from the head portion in one part than another so that, when inserted in the insertion position and rotated, a camming action of the further part on the moveable section moves it between a closed and an open position.

17. The peg of claim 16, wherein the terminating foot comprises the camming portion and is electrically conductive, and wherein, when the peg is inserted at an electrical insertion position, a wire inserted in the peg channel makes an electrical connection with the terminating foot and thereby with the moveable electrically conductive line section of the electrical insertion position.

18. The peg of claim 16, wherein the terminating foot comprises the camming portion, and wherein the peg shaft comprises an external cutaway slot arranged so that, when the peg is inserted at an electrical insertion position, a projecting electrical contact of the moveable electrically conductive line section at that position makes an electrical connection through the slot with a wire inserted in the peg channel.

19. The peg of claim 16, wherein the terminating foot comprises the camming portion, and wherein the channel comprises an opening in the terminating foot so that, when the peg is inserted at an electrical insertion position, a projecting electrical contact of the moveable electrically conductive line section at that position makes an electrical connection through the opening with a wire inserted in the peg channel.

20. The peg of claim 16, wherein the peg shaft comprises an external cutaway slot through which, when the peg is inserted at an electrical insertion position, the protruding contacting portion of a projecting electrical contact of the moveable electrically conductive line section at that position makes an electrical connection through the slot with a wire inserted in the peg channel, and wherein the slot is shaped so as to form the camming portion operable for exerting a camming action on the protruding contacting portion.

* * * * *